(12) United States Patent
Leray

(10) Patent No.: US 10,553,400 B2
(45) Date of Patent: Feb. 4, 2020

(54) METHODS AND APPARATUS FOR FREQUENCY GENERATOR AND MATCH NETWORK COMMUNICATION

(71) Applicant: APPLIED MATERIALS, INC., Santa Clara, CA (US)

(72) Inventor: Gary Leray, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/941,151

(22) Filed: Mar. 30, 2018

(65) Prior Publication Data
US 2019/0304753 A1   Oct. 3, 2019

(51) Int. Cl.
| H01J 37/32 | (2006.01) |
| H02J 50/20 | (2016.01) |
| H03K 5/24 | (2006.01) |
| H01L 21/67 | (2006.01) |
| H03K 5/00 | (2006.01) |

(52) U.S. Cl.
CPC .. H01J 37/32183 (2013.01); H01J 37/32128 (2013.01); H02J 50/20 (2016.02); H03K 5/24 (2013.01); *H01J 2237/332* (2013.01); *H01J 2237/334* (2013.01); *H01L 21/67069* (2013.01); *H03K 2005/00013* (2013.01)

(58) Field of Classification Search
CPC ............... H01J 37/32082; H01J 37/321; H01J 37/3211; H01J 37/32165; H01J 37/32155; H01J 37/32183; H01J 37/32211; H01J 37/32256; H01J 37/32128; A61B 18/042; A61B 18/1206; A61B 2018/1823; A61B 2018/00785; A61B 2018/008; A61B 2018/00779; A61B 2018/128
See application file for complete search history.

(56) References Cited

U.S. PATENT DOCUMENTS

| 6,660,134 | B1 * | 12/2003 | Gopalraja | H01J 37/321 |
| | | | | 118/723 I |
| 6,784,405 | B2 * | 8/2004 | Flugstad | A23B 4/01 |
| | | | | 219/497 |
| 9,088,267 | B2 * | 7/2015 | Blackburn | H01J 37/32183 |
| 9,114,666 | B2 | 8/2015 | Valcore, Jr. et al. | |
| 9,318,304 | B2 | 4/2016 | Leray et al. | |
| 9,333,034 | B2 * | 5/2016 | Hancock | A61B 18/042 |
| 9,595,423 | B2 * | 3/2017 | Leray | H01J 37/32082 |
| 9,596,744 | B2 * | 3/2017 | Leeser | H05H 1/46 |
| 9,614,524 | B1 | 4/2017 | Kawasaki | |
| 9,754,767 | B2 | 9/2017 | Kawasaki | |
| 9,788,405 | B2 | 10/2017 | Kawasaki et al. | |
| 2017/0062186 | A1 * | 3/2017 | Coumou | H01J 37/32155 |

* cited by examiner

*Primary Examiner* — Haissa Philogene
(74) *Attorney, Agent, or Firm* — Moser Taboada; Alan Taboada

(57) ABSTRACT

Methods and apparatus for providing RF power to a semiconductor process chamber including generating an analog radio frequency (RF) power waveform with a frequency generator for transmission to a match network over a first connection, determining information associated with characteristics of the RF power waveform with the frequency generator and transmitting the information to the match network over a second connection, and adjusting the match network to the RF power waveform based, at least partially, on the information associated with characteristics of the RF power waveform from the second connection.

20 Claims, 6 Drawing Sheets

METHODS AND APPARATUS FOR FREQUENCY GENERATOR AND MATCH NETWORK COMMUNICATION

FIELD

Embodiments of the present principles generally relate to semiconductor processing.

BACKGROUND

In some forms of semiconductor processing, radio frequency (RF) power is used to aid in the deposition or the etching of materials on a substrate. A match network is employed to ensure that RF power is efficiently transferred to the semiconductor process chamber. The match network adjusts impedances to compensate for changing frequencies produced by an RF power supply to reduce reflected power. The RF power supply sends RF power to the match network which adjusts the impedances before transferring the RF power to a semiconductor process chamber. The adjustment of the impedance by the match network is not accomplished instantaneously and each frequency change takes a certain amount of time for the adjustment. If the frequency of the RF power is changing frequently or the match network is busy tuning, the match network may not be fast enough to compensate for the frequency changes.

Thus, the inventor has provided improved methods and apparatus for frequency generator and match network communication.

SUMMARY

Methods and apparatus provide frequency generator and match network communications for supplying RF power for semiconductor processes.

In some embodiments, a method of a method for providing RF power to a semiconductor process chamber comprises generating an analog radio frequency (RF) power waveform with a frequency generator for transmission to a match network over a first connection, determining information associated with characteristics of the RF power waveform with the frequency generator and transmitting the information to the match network over a second connection, and adjusting the match network to the RF power waveform based, at least partially, on the information associated with characteristics of the RF power waveform from the second connection.

In some embodiments, the method further includes forming a synchronization waveform based, at least partially, on the RF power waveform with the frequency generator and transmitting the synchronization waveform to the match network, determining at least one difference between the RF power waveform and the synchronization waveform with the frequency generator and transmitting the at least one difference to the match network, and recreating at least a portion of the RF power waveform based, at least partially, on the at least one difference between the RF power waveform and the synchronization waveform within the match network; transmitting the at least one difference from the frequency generator to the match network over the second connection or transmitting the at least one difference from the frequency generator to the match network over a third connection; forming a synchronization waveform with a first sync level based on a first RF power level of the RF power waveform and a second sync level based on a second RF power level with the frequency generator and transmitting the synchronization waveform to the match network, determining at least one characteristic of a third RF power level from the RF power waveform with the frequency generator and transmitting the at least one characteristic of the third RF power level from the frequency generator to the match network, and recreating the third RF power level of the RF power waveform based, at least partially, on the at least one characteristic of a third RF power level and the synchronization waveform in the match network; and/or transmitting the synchronization waveform from the frequency generator to the match network over a fourth connection and transmitting the at least one characteristic of the third RF power level from the frequency generator to the match network over the second connection or over a third connection.

In some embodiments, a method for providing RF power to a semiconductor process chamber comprises generating, by a frequency generator, an analog radio frequency (RF) power waveform for transmission to a match network over a first connection and determining, by the frequency generator, information associated with characteristics of the RF power waveform for transmitting to the match network over a second connection.

In some embodiments, the method further includes forming, by a frequency generator, a synchronization waveform based, at least partially, on the RF power waveform and determining, by the frequency generator, at least one difference between the RF power waveform and the synchronization waveform for transmitting to the match network; transmitting, by the frequency generator, the at least one difference to the match network over the second connection or transmitting the at least one difference to the match network over a third connection; forming, by the frequency generator, a synchronization waveform with a first sync level based on a first RF power level of the RF power waveform and a second sync level based on a second RF power level and determining, by the frequency generator, at least one characteristic of a third RF power level from the RF power waveform for transmitting to the match network; transmitting, by the frequency generator, the synchronization waveform to the match network over a fourth connection and transmitting, by the frequency generator, the at least one characteristic of the third RF power level to the match network over the second connection or over a third connection; determining, by the frequency generator, a timing delay between arrival of the synchronization waveform and arrival of the RF power waveform for transmitting to the match network; and/or wherein the timing delay includes, at least, a propagation delay of the RF power waveform from the frequency generator to the match network.

In some embodiments, a method for providing RF power to a semiconductor process chamber comprises receiving, by a match network, information associated with characteristics of an analog radio frequency (RF) power waveform over a first connection, receiving, by the match network, an analog radio frequency (RF) power waveform transmitted by a frequency generator over a second connection, and adjusting the match network to the RF power waveform based, at least partially, on the information associated with characteristics of the RF power waveform.

In some embodiments, the method further includes adjusting the match network by tuning the impedance of the match network based, at least partially, on the information associated with characteristics of the RF power waveform, receiving, prior to the RF power waveform by the match network, a synchronization waveform based, at least partially, on the RF power waveform, receiving, by the match network, at least one difference between the RF power waveform and the synchronization waveform, and recreating, by the match network, at least a portion of the RF power waveform based, at least partially, on the at least one difference between the RF power waveform and the synchronization waveform; receiving, by the match network, the at least one difference from the frequency generator over the first connection or receiving the at least one difference from the frequency generator over a third connection; receiving, by the match network, a synchronization waveform with a first sync level based on a first RF power level of the RF power waveform and a second sync level based on a second RF power level, receiving, by the match network, at least one characteristic of a third RF power level from the RF power waveform, and adjusting the match network based on the at least one characteristic of the third RF power level to the match network; receiving, by the match network, the synchronization waveform from the frequency generator over a fourth connection and receiving, by the match network, the at least one characteristic of the third RF power level from the frequency generator over the second connection or over a third connection; receiving, by the match network, a timing delay between arrival of the synchronization waveform and arrival of the RF power waveform and adjusting the match network based on the timing delay; and/or wherein the timing delay includes, at least, a propagation delay of the RF power waveform from the frequency generator to the match network.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
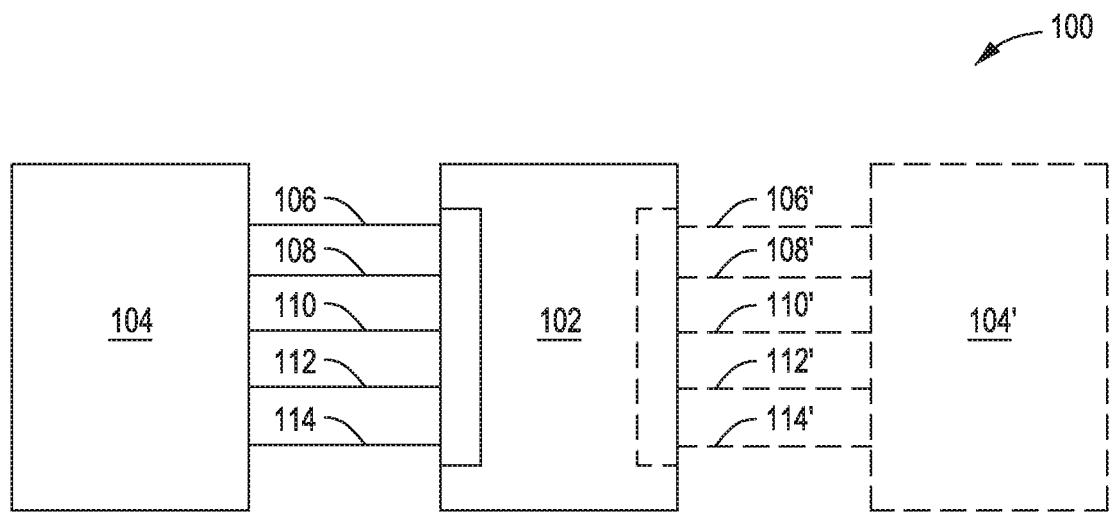
FIG. 1 is an apparatus for delivering RF power to a semiconductor process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

A frequency generator and a match network will attempt to adjust impedances independent of the other. The frequency generator and the match network observe a semiconductor process system from different viewpoints and do not see the same system changes at the same time. In other words, the frequency generator and the match network are not fully synchronized together. To increase stability and performance, RF frequency information is sent between the frequency generator and the match network over a digital connection to aid in synchronization. The RF frequency information allows the match network to understand in close to real time how the frequency generator is operating. An analog RF signal sent from the frequency generator may indicate to the match network when a trigger signal goes high and when the trigger signal goes low as part of a basic operation. The inventor has discovered that with the RF frequency information provided over a communication connection, the communication between the frequency generator and the match network can be improved to advantageously provide faster and more efficient operations.

A match network generally receives an RF signal from the frequency generator and attempts to synchronize the match network's internal frequency with the frequency of the frequency generator using internal algorithms in the match network. The internal algorithms of the match network are slow and have poor accuracy. The inventor has discovered that the deficiency of the internal algorithms can be overcome by allowing the frequency generator to directly communicate RF frequency information to the match network. The frequency generator controls the frequency generated and can provide RF frequency information in or near real time to the match network. The match network can then use the RF frequency information to perform sensor compensation, data processing, etc., significantly improving response times.

In order to reduce or eliminate time lag and costs, a simple signal may be used to communicate the RF frequency information from the frequency generator to the match network. In addition, a two level transistor-transistor-logic (TTL) signal may be used to describe a more advanced pulse waveform by using, for instance, maximum time data so that the match network knows when a TTL state waveform received from the frequency generator will actually change to a different state and for what duration. The RF frequency information sent from the frequency generator allows for faster and more accurate tuning synchronization between the frequency generator and the match network, beneficially providing a more stable semiconductor process system.

Without the RF frequency information, the match network is left to perform tuning based on a received RF OUT signal (analog signal). When the match network attempts to detect the RF frequency using internal algorithms, the match network does not perform very well. Given the analog signal, the match network must first take time to collect data points and then perform data processing on the data points to determine the frequency of a pulse of the RF OUT signal.

The match network may employ, for example, a Fourier analysis which takes time to converge to a final value. The duration of collecting data, processing data, and converging to a value can take a significant amount of time. If a determined frequency value is incorrect, the analysis will also be incorrect, and the match network will take even longer to converge to the correct frequency. The time spent by the match network on determining the frequency decreases the time for performing tuning or collecting data, reducing the performance of the match network and subsequently the semiconductor processing system.

Because additional states or levels may be provided by the frequency generator to the match network for each pulse of the RF OUT signal by way of the RF frequency information, better process performance can be achieved without requiring additional synchronization waveform complexity. For example, a two level synchronization signal may be used to represent a three level RF power output. An intermediate level can be achieved by transmitting frequency, timing, and duration information from the frequency generator to the match network to indicate when and for how long the intermediate RF power will last relative to, for example, a first RF power level indicated by the synchronization signal. The additional information allows for the match network hardware to maintain a two level TTL system while advantageously increasing synchronization performance and reducing costs. The additional information provided by the frequency generator advantageously increases frequency resolution and advantageously describes a more advanced waveform.

The match network, without the RF frequency information, can only perform threshold detections or similar schemes. The match network attempts to see the signal and tries to understand how the frequency generator is operating. If the frequency generator is performing single level pulsing, a two level ON/OFF signal is sent to the match network that is easily detectable because the match network just detects ON (high level) and detects OFF (low level). When the number of RF power levels is increased, the complexity is greatly increased because the multiple states may have different frequencies and power levels and a threshold detection scheme can no longer be used. By providing the RF frequency information from the frequency generator to the match network, through analog triggers and/or through one or more digital links, the match network can be fully aware of any number of pulse waveforms.

FIG. 1 is an apparatus 100 for delivering RF power to a semiconductor process chamber that includes a match network 102 and a first frequency generator 104 and, optionally, at least one second frequency generator 104' (for a dual frequency system). An RF connection 106 (and 106') provides an analog RF power signal to the match network 102. A SYNC connection 108 (and 108') provides an analog synchronization signal to the match network 102. The synchronization signal may be an analog TTL signal. A pulse information connection 110 (and 110') provides an analog and/or digital pulse information signal to the match network. The pulse information signal provides additional pulse information not provided by the synchronization signal. An RF frequency information connection 112 (and 112') provides an analog and/or digital RF frequency information signal to the match network 102. The RF frequency information signal provides, at least, information pertaining to the RF frequency generated by a frequency generator 104, 104' for each pulse of the RF power signal. In some embodiments, the connection for the RF frequency information signal may, for example, contain both the RF frequency information and the pulse information. An optional dual frequency setup connection 114 (and 114') may provide a digital dual frequency setup signal to the match network 102. The dual frequency setup signal may provide information relating to each of the dual frequencies such as, for example, frequency information, pulse information, timing information, and the like.

In legacy systems, the frequency generator and the match network are connected with an analog high power RF cable. Existing TTL type signals are sent from the frequency generator to the match network over a separate low power analog cable. Based on the present principles, the RF frequency information may be digital information that is sent over a digital connection/cable from the frequency generator to the match network. In some embodiments, the RF frequency information may be analog information that is sent over an analog connection/cable from the frequency generator to the match network. The connection for the RF frequency information may include, but is not limited to, RF frequency information for each RF power signal pulse and/or synchronization pulse information such as timing delays relative to the RF analog signal, and/or timing and duration information of an additional RF power level not indicated directly by the synchronization pulse (to be recreated by the match network), etc. The synchronization pulse information and the RF frequency information may be provided by the frequency generator to the match network on a single analog/digital connection and/or separate analog/digital connections.

Figure 2:
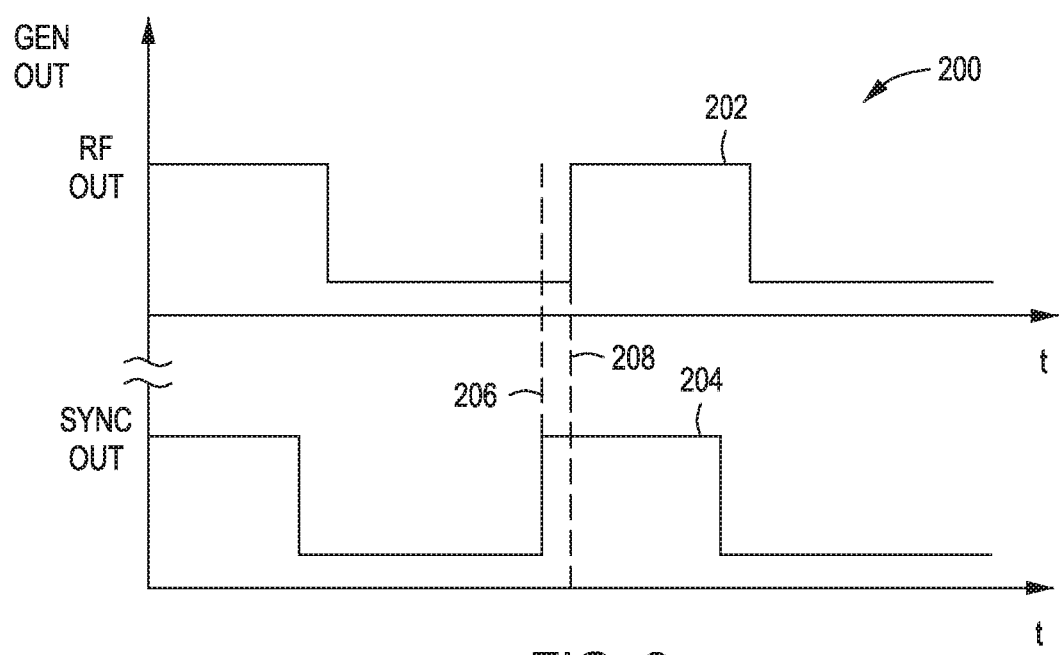
FIG. 2 is a graph illustrating signal timing for a frequency generator in a semiconductor process system in accordance with some embodiments of the present principles.

Pulse signals in a semiconductor process system need to be synchronized to eliminate issues such as, for example, overlapping states that cause transients that affect the stability of the system. FIG. 2 is a graph 200 illustrating signal timing for a frequency generator in a semiconductor process system. The frequency generator sends a SYNC OUT signal at a first time 206 at a first sync level 204, for example, prior to sending an RF OUT signal at a first RF level 202 at a second time 208. The SYNC OUT signal is then received first by the match network, allowing the match network to make adjustments ahead of receiving the RF OUT signal. In some embodiments, delaying the RF OUT signal at the frequency generator may not be necessary, allowing the signals to be sent at the same time. Because of the physical analog cable between the frequency generator and the match network, a signal over the analog cable is affected by propagation delays. Due to the delays, the RF OUT and the SYNC OUT signals may not arrive at exactly the same time in the match network even if transmitted at the same time by the frequency generator, allowing the SYNC OUT signal to be received first.

Figure 3:
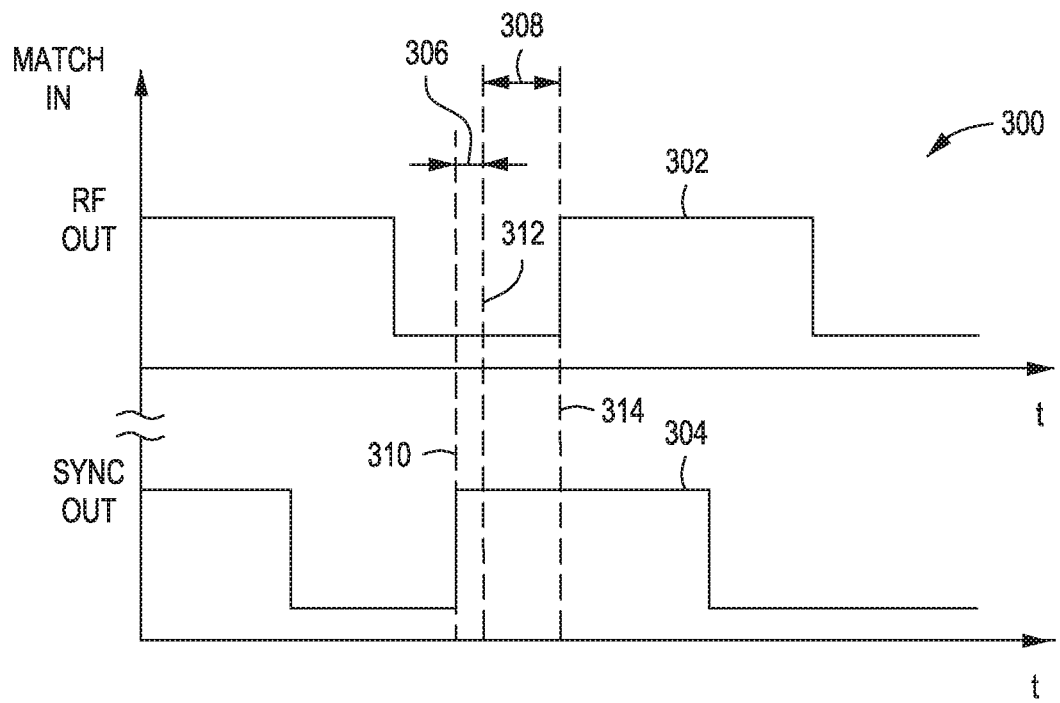
FIG. 3 is a graph illustrating signal timing for a match network in a semiconductor process system in accordance with some embodiments of the present principles.

FIG. 3 is a graph 300 illustrating signal timing for a match network in a semiconductor process system. The graph 300 shows a first sync level 304 of a SYNC OUT signal received by a match network at a first time 310. If a frequency generator delayed the sending of a first RF level 302 of RF OUT by a first delay 306, the match network would be told through the RF frequency information and/or the synchronization pulse information sent by the frequency generator to expect RF OUT at a second time 312. Due to propagation delays, an additional delay 308 may cause the RF OUT signal to be received at a third time 314. If the propagation delay value is known, the first delay 306 may be set to a zero value because the RF OUT signal will arrive after the SYNC OUT signal even without a transmitting delay by the frequency generator. The known propagation delay can be sent from the frequency generator to the match network with the RF frequency information and/or the synchronization pulse information.

In some embodiments, the RF frequency information may be used to calibrate the semiconductor process system to compensate for the signal propagation delays caused by the cabling. To reduce or eliminate delays in the semiconductor process system, the SYNC OUT, (e.g., two level TTL signal) arrives at the match network prior to the RF OUT signal. The RF frequency information and/or the synchronization pulse information can then be sent along with the SYNC OUT signal from the frequency generator to the match network to inform the match network to process the SYNC OUT signal with a given amount of delay for the RF OUT signal. For instance, the RF frequency information and/or the synchronization pulse information can be sent to the match network stating that the SYNC OUT signal (TTL signal) is ahead by, for example 10 microseconds. The match network can then process the SYNC OUT signal and knows to switch RF power level states 10 microseconds after the SYNC OUT trigger change.

Figure 4:
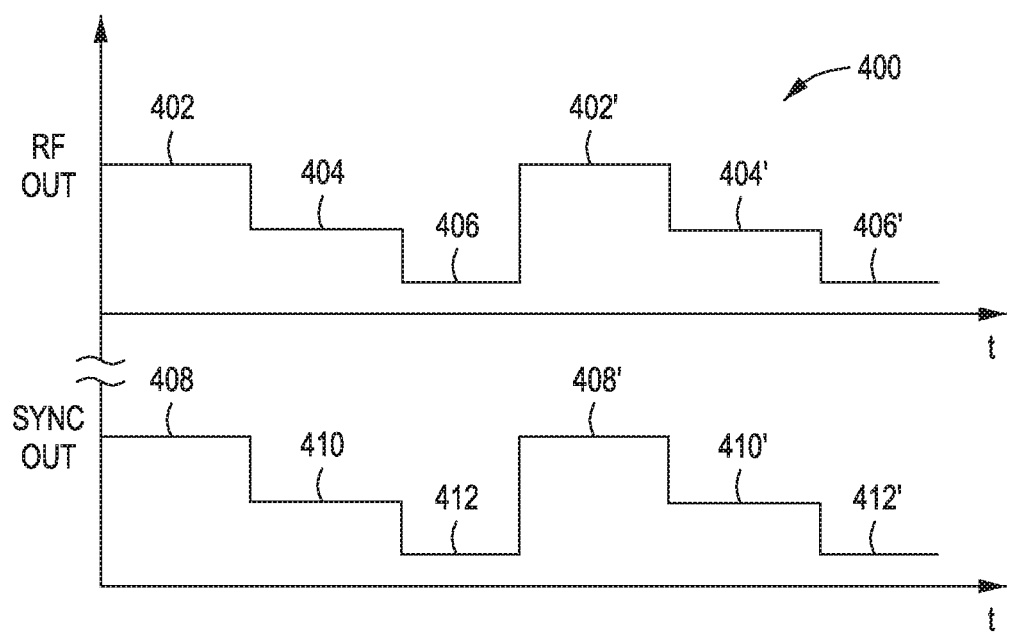
FIG. 4 is a method for linking a frequency generator to a match network with a three-level SYNC OUT signal in a semiconductor process system in accordance with some embodiments of the present principles.

FIG. 4 illustrates a method 400 for linking a frequency generator to a match network with a three-level SYNC OUT signal in a semiconductor process system. In some embodiments of the method 400, an analog signal (RF OUT) from a frequency generator to a match network is a multi-level pulse that is directly matched by a synchronization signal (SYNC OUT), pulse for pulse. In the example, a first SYNC OUT level 408 (and 408') is matched to a first RF OUT level 402 (and 402'). A second SYNC OUT level 410 (and 410') is matched to a second RF OUT level 404 (and 404'). A third SYNC OUT level 412 (and 412') is matched to a third RF OUT level 406 (and 406'). The relationship between the pulses of RF OUT and SYNC OUT is one for one. A semiconductor process system with matched RF OUT and SYNC OUT may use a significant amount of additional hardware at a considerable expense. In addition, most legacy semiconductor systems do not have a three or more level SYNC OUT signal available, only a two level TTL signal. By using the present principles, the two level information of the SYNC OUT can be utilized to reconstruct the full RF OUT waveform even with a system having a two level SYNC OUT. In some embodiments, signals between the frequency generator and the match network may include more than three levels for either the RF OUT and/or the SYNC out.

In some embodiments, information regarding an additional RF power level (state) is provided when SYNC OUT is a two level TTL signal. In the example, the frequency generator can send RF frequency information, including pulse information, to the match network telling the match network that, for example, during the TTL low state, the RF power actually has two states and that during the second state, the RF power is going to have a second value of ON time at a second frequency. The match network is then aware of the three states and knows where to tune and where to get the data, etc. The match network uses the analog signal and the RF frequency information and/or the synchronization pulse information from the analog/digital connection to recreate the full pulse waveform of the RF OUT signal even when portions are missing from the SYNC OUT signal.

For the example, the frequency generator can inform the match network that the match network needs to process three states even when the SYNC OUT is only providing two states and to tune to certain states and not to tune to other states, etc. A semiconductor process system with a third state where the pulse is, for example, zero, allows a new state of pulsing where semiconductor process system can advantageously control byproducts, etching, and/or energy levels, etc. Additional state levels beneficially gives the semiconductor process system advanced process control, better process control, and improved process performance. The present principles can be applied to semiconductor process systems to enable N-levels of RF power between the frequency generator and the match network. The N-levels allow for further fine tuning of the system for increasing the aforementioned benefits.

Figure 5:
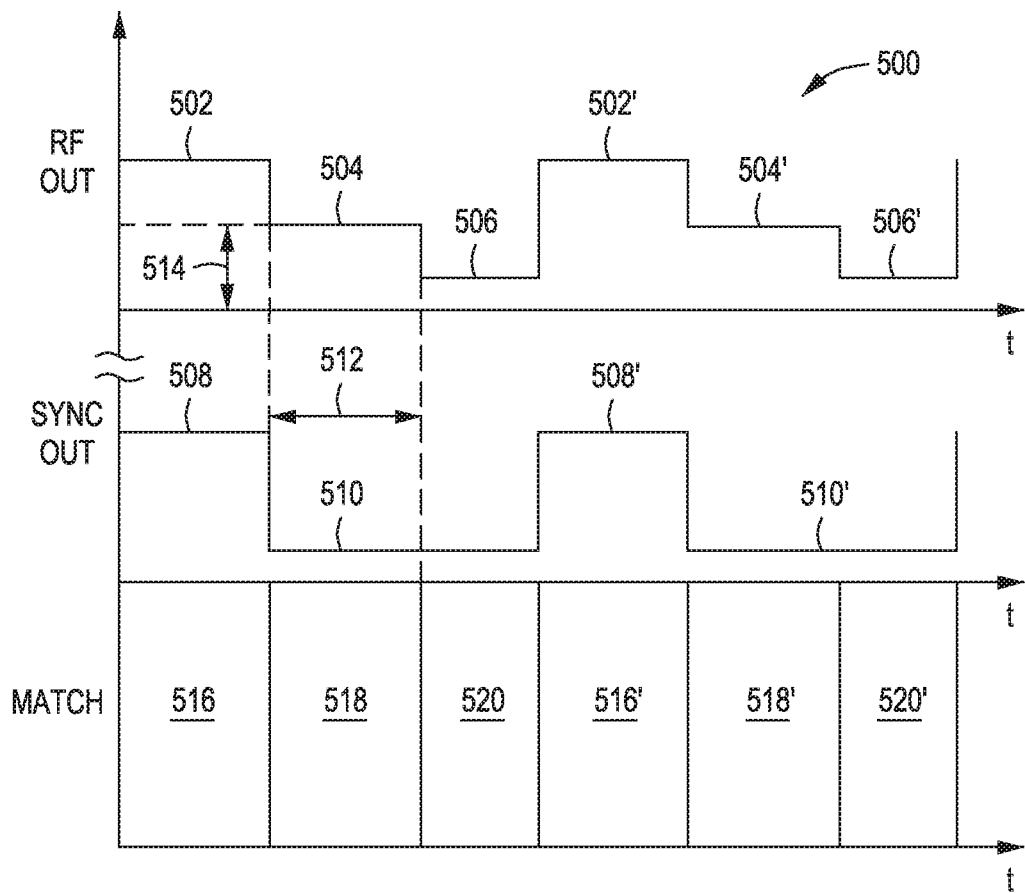
FIG. 5 is a method for linking a frequency generator to a match network with a two-level SYNC OUT signal in a semiconductor process system in accordance with some embodiments of the present principles.

FIG. 5 illustrates a method 500 for linking a frequency generator to a match network with a two-level SYNC OUT signal in a semiconductor process system. The example is shown setting aside any propagation or system created signal delays between the frequency generator and the match network. An RF OUT signal sent by a frequency generator has a first RF power level 502 with a first frequency, a second RF power level 504 with a second frequency, and a third RF power level 506 with a third frequency for a first RF power cycle (power levels are represented with prime symbols for subsequent power cycles). A SYNC OUT signal sent by a frequency generator has a first sync level 508 and a second sync level 510 for a first sync cycle (sync levels are represented with prime symbols for subsequent sync cycles). In the RF frequency information and/or the synchronization pulse information sent from the frequency generator to the match network, a description of the second RF power level 504 and second frequency may be sent relative to, for example, the first sync level 508. For example, a pulse duration 512 of the second RF power level relative to the end of the first sync level 508 and an RF power value 514 and frequency of the second RF power level 504 can be transmitted from the frequency generator to the match network. As described above, the match network can then recreate the RF power pulse waveform for further processing and/or tuning. In FIG. 5, the match network is shown dividing up the RF OUT pulse cycle and creating a first state 516, a second state 518, and a third state 520 for each RF power level 502, 504, 506, respectively, for a first RF cycle (states are represented with prime symbols for subsequent cycles) from data sent by the frequency generator. A state may contain an RF power value, a frequency, a timing duration (e.g., ON time), a timing starting point (e.g., relative to a particular sync pulse, etc.), and the like to allow the match network to easily recreate the RF power pulse waveform for each cycle.

In a dual frequency system (see, e.g., FIG. 1), the match network tries to measure the RF power pulse frequencies two times since each state could have a different RF frequency, so the workload is doubled and the delays are doubled. For example, in a legacy system, the frequency generator may be providing the frequency to the match network over an analog cable, but the match network is not able to find the frequency through detection, delaying the match network from starting to process data after the analog frequency signal is received. To resolve the performance issues, the above described methods and apparatus can also be advantageously applied to dual frequency systems, increasing the performance of the match network and stabilizing the semiconductor process system. In a dual frequency system two frequency generators are connected to a single match network, each frequency generator providing an RF power pulse at a different frequency and at different times and, possibly, at different power levels. A separate connection between each frequency generator and the match network may be used to pass information regarding each frequency generator and/or operating parameters such as, for example, frequency usage to the match network. The dual frequency information may also be passed over an analog/digital connection that is used for the pulse information and/or the frequency information. With the information from each of the frequency generators, the match network is able to quickly and efficiently adjust to a new frequency in the same manner as described above for a single frequency system.

Figure 6:
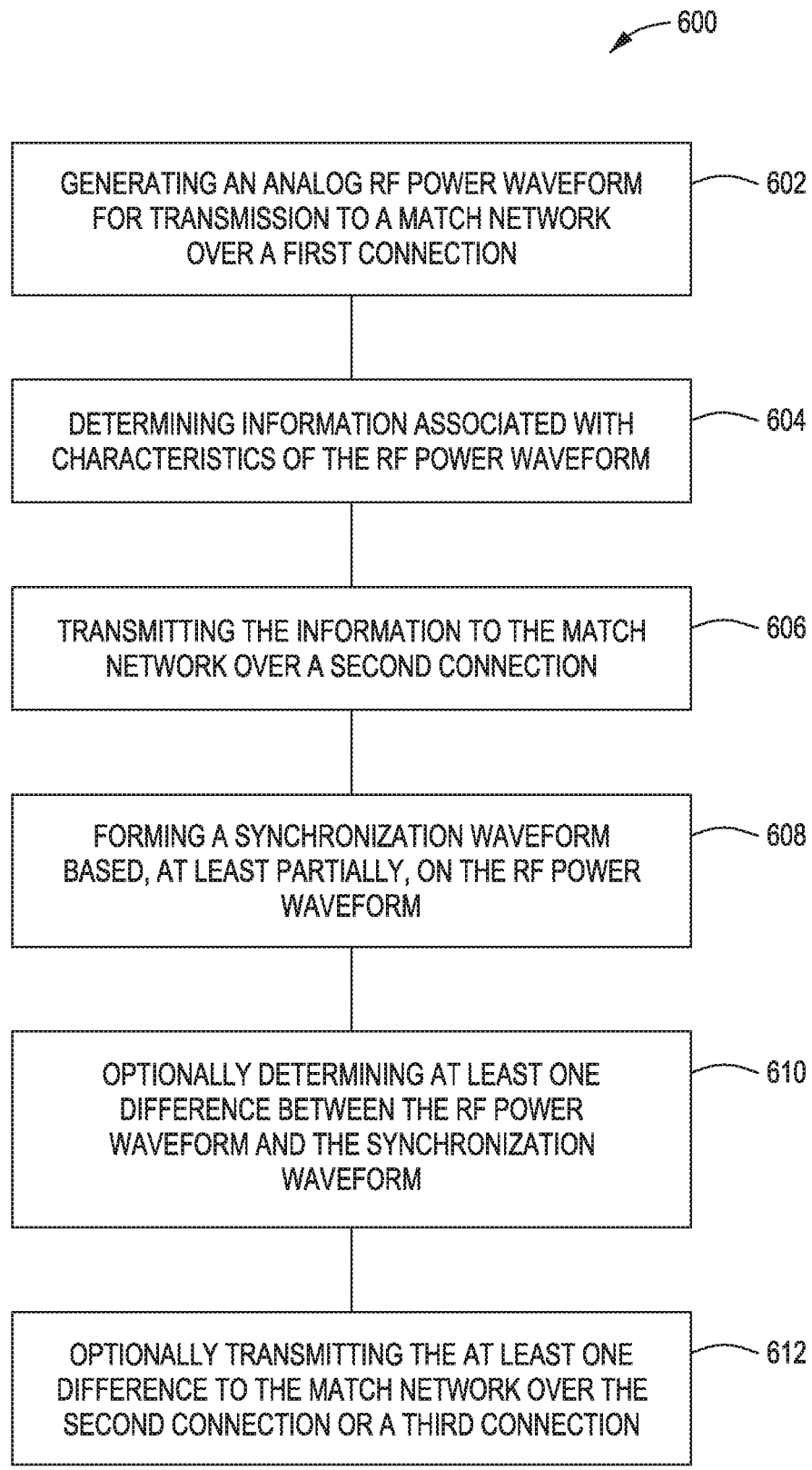
FIG. 6 is a method for providing information associated with a generated frequency by a frequency generator in a semiconductor process system in accordance with some embodiments of the present principles.

The following flow charts employ blocks that may or may not occur in the order shown for some embodiments. FIG. 6 is a method 600 for providing information associated with a generated frequency by a frequency generator in a semiconductor process system in accordance with some embodiments. In block 602, a frequency generator generates an analog RF power waveform for transmission to a match network over a first connection. The RF power waveform may be transmitted subsequently to the match network or may be preceded in transmission by a synchronization waveform discussed below. The first connection may be an analog connection between the frequency generator and the match network such as, for example, a coaxial cable and the like. In block 604, the frequency generator determines information associated with characteristics of the RF power waveform. The information may include, but is not limited to, one or more of the frequencies of the RF power waveform, the ON times or durations of the power levels, the values of the power levels, timing information, and the like. In some embodiments, the information may include characteristics of each pulse of the RF power waveform. In block 606, the frequency generator transmits the information to the match network over a second connection. The second connection may be an analog and/or digital connection between the frequency generator and the match network such as, for example, a wired or wireless connection and the like. The match network may use the received information to facilitate in determining the frequencies and other characteristics of the RF power waveform in place of or in conjunction with using internal algorithms to converge on the frequencies.

In block 608, the frequency generator forms a synchronization waveform based, at least partially, on the RF power waveform. If the synchronization waveform is limited to two levels such as, for example, in a TTL-based waveform, and the RF power waveform has more than two levels, the synchronization waveform may not match the RF power waveform pulse for pulse. In some embodiments, the frequency generator may transmit the synchronization waveform prior to transmitting the RF power waveform such that the match network knows when to expect the RF waveform and at which frequencies. In block 610, the frequency generator optionally determines at least one difference between the RF power waveform and the synchronization waveform. The determination is optional, for example, if the synchronization waveform has two levels and the RF power waveform has two levels, a difference may not be found between the two waveforms.

In block 612, if the frequency generator determines at least one difference between the RF power waveform and the synchronization waveform, the at least one difference is transmitted to the match network. In some embodiments, the frequency generator forms a synchronization waveform with a first sync level based on a first RF power level of the RF power waveform and a second sync level based on a second RF power level. The RF power waveform may also have a third RF power level. The frequency generator determines at least one characteristic of the third RF power level of the RF power waveform. The characteristic may include, but is not limited to, frequency, timing information, an ON time or duration, synchronization waveform trigger for determining when the third RF power level occurs, and the like. The characteristic may be transmitted as part of the at least one difference. The transmission of the at least one difference by the frequency generator may occur over the second connection used to send the information associated with the characteristics of the RF power waveform and/or over a third connection. The third connection may be an analog and/or digital connection between the frequency generator and the match network such as, for example, a wired or wireless connection and the like. In some embodiments, the frequency generator may transmit the synchronization waveform over a fourth connection. The fourth connection may be an analog connection that supports TTL waveforms and the like. The frequency generator may also determine a timing delay between the arrival of the synchronization waveform and the arrival of the RF power waveform. The timing delay may include, but is not limited to, a timing delay between the transmission of the RF power waveform and the synchronization waveform and/or a propagation delay of the RF power waveform caused by cable transmission and the like.

Figure 7:
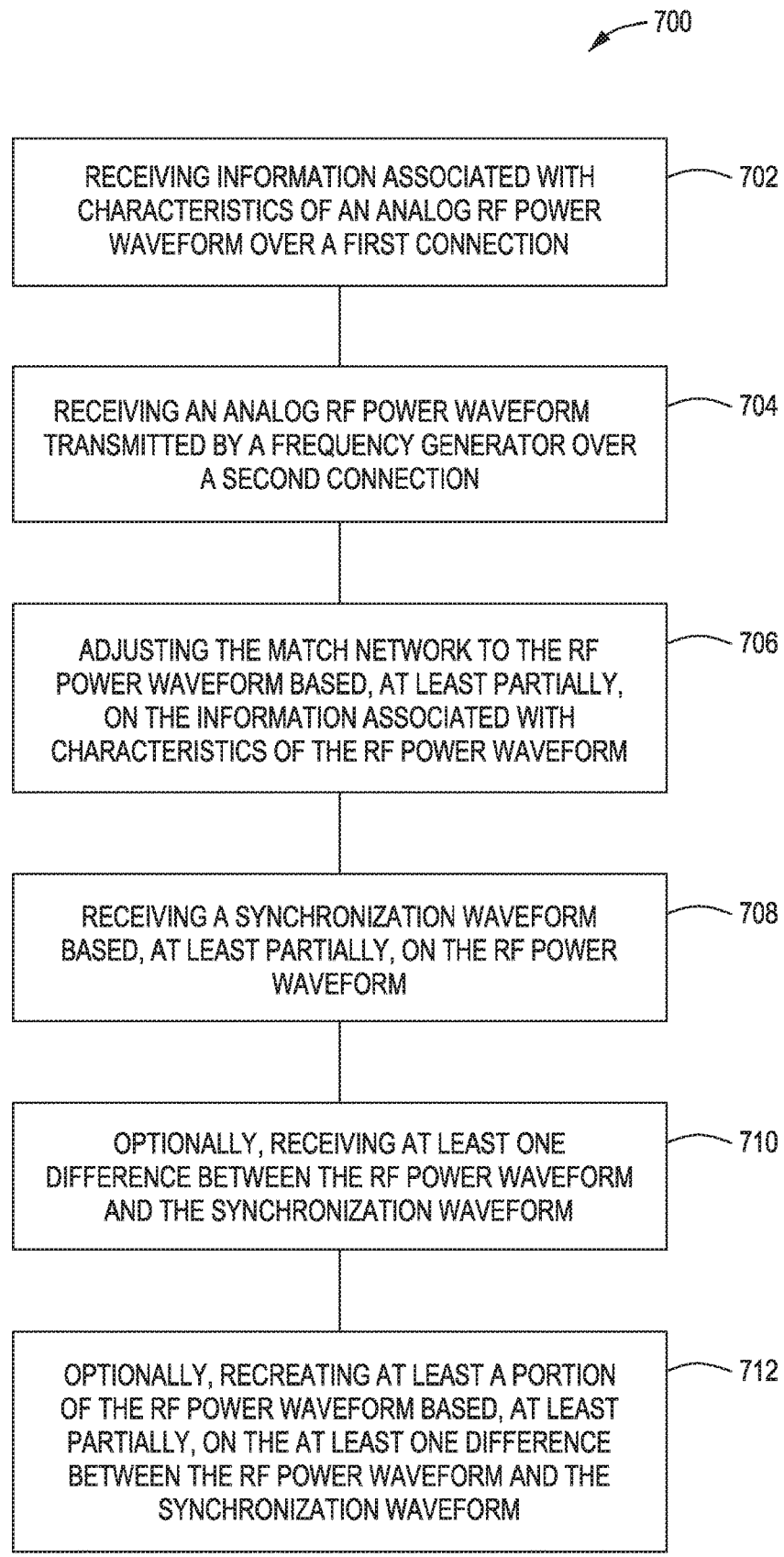
FIG. 7 is a method for receiving information associated with a generated frequency and adjusting a match network in a semiconductor process system in accordance with some embodiments of the present principles.

FIG. 7 is a method 700 for receiving information associated with a generated frequency and adjusting a match network in a semiconductor process system in accordance with some embodiments. In block 702, a match network receives information associated with characteristics of an analog RF power waveform over a first connection from a frequency generator. The first connection, in the example, may be an analog and/or digital connection such as a wired and/or wireless connection and the like. The information allows, for example, the match network to know and adjust to the frequency of an incoming RF power waveform before the RF power waveform is received. In block 704, the match network receives an analog RF power waveform at a given frequency transmitted by a frequency generator over a second connection. The second connection, in the example, may be an analog connection such as a coaxial cable and the like. In block 706, the match network adjusts the match network parameters for the RF power waveform based, at least partially, on the information associated with characteristics of the RF power waveform from the frequency generator. By using the information supplied by the frequency generator, the match network can advantageously find the RF power frequency for a pulse much faster than using internal algorithms to converge to the RF power frequency and with greater accuracy.

In block 708, the match network receives a synchronization waveform based, at least partially, on the RF power waveform. In some embodiments the match network may receive the synchronization waveform and/or synchronization pulse information in advance of the RF power waveform to allow the match network to know when and at which frequencies the RF power waveform is transmitted. In block 710, the match network optionally receives at least one difference between the RF power waveform and the synchronization waveform. For example, if the synchronization waveform and the RF power waveform match, the match network may not receive at least one difference from the frequency generator. In block 712, the match network optionally recreates at least a portion of the RF power waveform based, at least partially, on the at least one difference between the RF power waveform and the synchronization waveform. In some embodiments, the match network may receive the at least one difference from the frequency generator over the first connection or receive the at least one difference from the frequency generator over a third connection. The third connection may be an analog and/or a digital connection such as, for example, a wired and/or wireless connection and the like. For example, the at least one difference can be sent as part of the synchronization pulse information and/or as part of the RF frequency information from the frequency generator to the match network.

In some embodiments, the match network may receive a synchronization waveform with a first sync level based on a first RF power level of the RF power waveform and a second sync level based on a second RF power level. The match network may also receive at least one characteristic of a third RF power level from the RF power waveform. The match network may then adjust parameters based on the at least one characteristic of the third RF power level. The match network may receive the synchronization waveform from the frequency generator over a fourth connection. The fourth connection may be an analog connection that is capable of transmitting TTL waveforms and the like. The match network may receive the at least one characteristic of the third RF power level from the frequency generator over the first connection and/or over the third connection. For example, the at least one characteristic can be sent as part of the synchronization pulse information and/or as part of the RF frequency information from the frequency generator to the match network.

In some embodiments, the match network adjusts impedances based, at least partially, on the information associated with characteristics of the RF power waveform. In some embodiments, the match network receives a timing delay between the arrival of the synchronization waveform and the arrival of the RF power waveform and adjusts the match network based on the timing delay. In some embodiments, the timing delay includes, at least, a propagation delay of the RF power waveform from the frequency generator to the match network.

Figure 8:
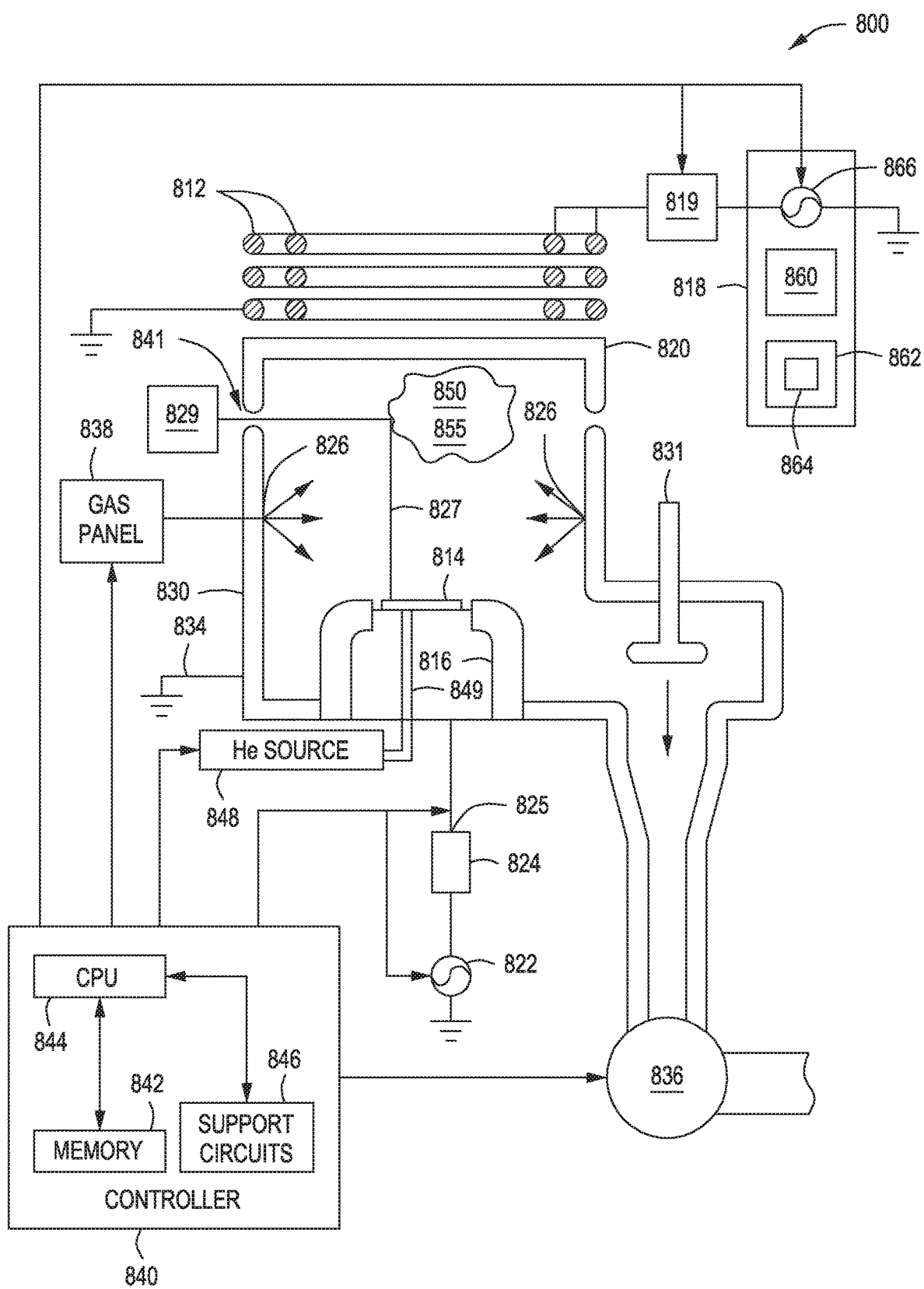
FIG. 8 depicts a process chamber suitable to perform methods or use apparatus for supplying radio frequency power to the process chamber in accordance with some embodiments of the present principles.

In a semiconductor process environment, frequency generators and match networks may be used in pairs to supply RF power to generate plasma in a process chamber. In some embodiments two or more frequency generators may be linked to a match network to supply RF power to generate plasma in a process chamber (dual frequency systems). FIG. 8 depicts a process chamber 800 suitable for using an apparatus and/or for performing a method for providing RF power to the process chamber in accordance with some embodiments. The inventive apparatus and methods may be utilized in conjunction with any type of process chamber utilizing RF power provided by an RF power source, for example, such as the process chamber 800 and RF power source 818 or biasing power source 822.

During processing, the RF power source 818 provides power to ignite a gaseous mixture 850 and maintain a plasma 855 in the process chamber 800. The biasing power source 822 also provides RF power to the process chamber to bias a substrate 814. The RF power source 818 and the biasing power source 822 are synchronized to operate at the same frequency to prevent a beat effect (frequency difference between RF sources operating on the same chamber) from occurring in the process chamber 800. The apparatus and methods may also be utilized in conjunction with any type of process chamber utilizing bias power having single or multiple frequencies. Exemplary process chambers include any process chamber used for etching processes, for example, such as the CENTRIS® or ADVANTEDGE™, or other process chambers, available from Applied Materials, Inc. of Santa Clara, Calif. Other process chambers, including those from other manufacturers, may similarly be used.

The RF power source 818 may have a frequency tuner 860 that facilitates in achieving an optimal impedance between the RF power source 818 and a load (e.g., the plasma 855). The RF power source 818 may also include a controller 862 and a memory 864 for storing information related to frequency tuning such as, for example, frequencies, impedances, and/or power levels. When a frequency generator of a power source is frequency tuning, the frequency generator will ignore RF frequency set points (e.g., reference frequencies, etc.) and will try to minimize reflected power as measured at the output of the frequency generator to get an impedance match. Reflected power is typically reduced to a target of about 0% of a forward power provided by the RF power source 818 to achieve a tuned state. In some embodiments, an allowable band of reflected power may be considered a tuned state depending on the chamber design. In some embodiments, information may be stored by a controller 840 linked with the RF power source 818 and the biasing power source 822, such as for example, in memory 842 of controller 840. The process chamber 800 may be utilized alone or as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors include the CENTRIS® SYM3™ Etch, the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other process chambers and/or cluster tools may suitably be used as well.

The process chamber 800 has a substrate support 816 (including a cathode) within a conductive body or wall 830 and a controller 840. The process chamber 800 may be supplied with a flat dielectric ceiling 820. Alternatively, the process chamber 800 may have other types of ceilings, e.g., a dome-shaped ceiling. An antenna comprising at least one inductive coil element 812 is disposed above the ceiling 820 (two co-axial elements of the at least one inductive coil element 812 are shown). The at least one inductive coil element 812 is coupled to the RF power source 818 through a first matching network 819. The first matching network 819 is held during frequency tuning. In some embodiments, the first matching network 819 may be used due to the different fixed positions for different processes. In some embodiments, the RF power source 818 may be capable of producing up to 3000 W at a tunable frequency in a range from about +/−5% to about +/−10% of the frequency generator output. For example, a 13.56 MHz RF power source may produce a tunable frequency in a range from about +/−5% to about +/−10% of 13.56 MHz. The RF power source 818 may include an RF generator 866, the frequency tuner 860, and the controller 862 that includes the memory 864 for storing process information. In some embodiments, the RF power source 818 may be controlled by controller 840.

The substrate support 816 may include an electrostatic chuck for retaining the substrate 814 and is coupled, through a second matching network 824 having a matching network output (cathode input) 825, to the biasing power source 822. In some embodiments, the biasing power source 822 may be capable of producing up to 1500 W at a frequency of approximately 13.56 MHz. The biasing power may be either continuous or pulsed power. In some embodiments, the biasing power source 822 may be a DC or pulsed DC source. In some embodiments, a probe 827 may be disposed within the process chamber 800 near the substrate support 816 to provide measurements within the process chamber 800. The probe 827 may be fed out of the process chamber 800 via a port 841 disposed in the wall 830 of the process chamber 800. In some embodiments, a controller 829 may be coupled to the probe 827 to facilitate recording or displaying the measurements of the probe 827.

The controller 840 (e.g., system controller) generally comprises a central processing unit (CPU) 844, a memory 842, and support circuits 846 for the CPU 844 and facilitates control of the components of the process chamber 800. To facilitate control of the process chamber 800, the controller 840 may be one of any form of general-purpose computer processor that can be used in an industrial setting for controlling various chambers and sub-processors. The memory 842, or computer-readable medium, of the CPU 844 may be one or more of readily available memory such as random access memory (RAM), read only memory (ROM), floppy disk, hard disk, or any other form of digital storage, local or remote. The support circuits 846 are coupled to the CPU 844 for supporting the processor. These circuits include cache, power supplies, clock circuits, input/output circuitry and subsystems, and the like. The methods described herein are generally stored in the memory 842 as a software routine. The software routine may also be stored and/or executed by a second CPU (not shown) that is remotely located from the hardware being controlled by the CPU 844.

In an exemplary operation of the process chamber 800, the substrate 814 is placed on the substrate support 816 and process gases are supplied from a gas panel 838 through entry ports 826 and form the gaseous mixture 850. The gaseous mixture 850 is ignited into a plasma 855 in the process chamber 800 by applying power from the RF power source 818 and the biasing power source 822 to the at least one inductive coil element 812 and the substrate 814 on the substrate support 816, respectively. The pressure within the interior of the process chamber 800 is controlled using a throttle valve 831 and a vacuum pump 836. Typically, the wall 830 is coupled to an electrical ground 834. The temperature of the wall 830 may be controlled using liquid-containing conduits (not shown) that run through the wall 830.

In some embodiments, the temperature of the substrate 814 may be controlled by stabilizing a temperature of the substrate support 816. In some embodiments, a gas from a gas source 848 is provided via a gas conduit 849 to channels (not shown) formed in the pedestal surface under the substrate 814. The gas is used to facilitate heat transfer between the substrate support 816 and the substrate 814. During processing, the substrate support 816 may be heated by a resistive heater (not shown) within the substrate support 816 to a steady state temperature and then the helium gas facilitates uniform heating of the substrate 814.

While the foregoing is directed to embodiments of the present principles, other and further embodiments of the principles may be devised without departing from the basic scope thereof.

The invention claimed is:

1. A method for providing RF power to a semiconductor process chamber, comprising:
   generating an analog radio frequency (RF) power waveform with a frequency generator for transmission to a match network over a first connection;
   determining information associated with characteristics of the RF power waveform with the frequency generator and transmitting the information to the match network over a second connection; and
   adjusting the match network to the RF power waveform based, at least partially, on the information associated with characteristics of the RF power waveform from the second connection.

2. The method of claim 1, further comprising:
   forming a synchronization waveform based, at least partially, on the RF power waveform with the frequency generator and transmitting the synchronization waveform to the match network;
   determining at least one difference between the RF power waveform and the synchronization waveform with the frequency generator and transmitting the at least one difference to the match network; and
   recreating at least a portion of the RF power waveform based, at least partially, on the at least one difference between the RF power waveform and the synchronization waveform within the match network.

3. The method of claim 2, further comprising:
   transmitting the at least one difference from the frequency generator to the match network over the second connection or transmitting the at least one difference from the frequency generator to the match network over a third connection.

4. The method of claim 2, further comprising:
   forming a synchronization waveform with a first sync level based on a first RF power level of the RF power waveform and a second sync level based on a second RF power level with the frequency generator and transmitting the synchronization waveform to the match network;
   determining at least one characteristic of a third RF power level from the RF power waveform with the frequency generator and transmitting the at least one characteristic of the third RF power level from the frequency generator to the match network; and
   recreating the third RF power level of the RF power waveform based, at least partially, on the at least one characteristic of a third RF power level and the synchronization waveform in the match network.

5. The method of claim 4, further comprising:
   transmitting the synchronization waveform from the frequency generator to the match network over a fourth connection; and
   transmitting the at least one characteristic of the third RF power level from the frequency generator to the match network over the second connection or over a third connection.

6. A method for providing RF power to a semiconductor process chamber, comprising:
   generating, by a frequency generator, an analog radio frequency (RF) power waveform for transmission to a match network over a first connection; and
   determining, by the frequency generator, information associated with characteristics of the RF power waveform for transmitting to the match network over a second connection.

7. The method of claim 6, further comprising:
   forming, by a frequency generator, a synchronization waveform based, at least partially, on the RF power waveform; and
   determining, by the frequency generator, at least one difference between the RF power waveform and the synchronization waveform for transmitting to the match network.

8. The method of claim 7, further comprising:
transmitting, by the frequency generator, the at least one difference to the match network over the second connection or transmitting the at least one difference to the match network over a third connection.

9. The method of claim 7, further comprising:
forming, by the frequency generator, a synchronization waveform with a first sync level based on a first RF power level of the RF power waveform and a second sync level based on a second RF power level; and
determining, by the frequency generator, at least one characteristic of a third RF power level from the RF power waveform for transmitting to the match network.

10. The method of claim 9, further comprising:
transmitting, by the frequency generator, the synchronization waveform to the match network over a fourth connection; and
transmitting, by the frequency generator, the at least one characteristic of the third RF power level to the match network over the second connection or over a third connection.

11. The method of claim 7, further comprising:
determining, by the frequency generator, a timing delay between arrival of the synchronization waveform and arrival of the RF power waveform for transmitting to the match network.

12. The method of claim 11, wherein the timing delay includes, at least, a propagation delay of the RF power waveform from the frequency generator to the match network.

13. A method for providing RF power to a semiconductor process chamber, comprising:
receiving, by a match network, information associated with characteristics of an analog radio frequency (RF) power waveform over a first connection;
receiving, by the match network, the analog radio frequency (RF) power waveform transmitted by a frequency generator over a second connection; and
adjusting the match network to the RF power waveform based, at least partially, on the information associated with characteristics of the RF power waveform.

14. The method of claim 13, further comprising:
adjusting the match network by tuning the impedance of the match network based, at least partially, on the information associated with characteristics of the RF power waveform.

15. The method of claim 13, further comprising:
receiving, prior to the RF power waveform by the match network, a synchronization waveform based, at least partially, on the RF power waveform;
receiving, by the match network, at least one difference between the RF power waveform and the synchronization waveform; and
recreating, by the match network, at least a portion of the RF power waveform based, at least partially, on the at least one difference between the RF power waveform and the synchronization waveform.

16. The method of claim 15, further comprising:
receiving, by the match network, the at least one difference from the frequency generator over the first connection or receiving the at least one difference from the frequency generator over a third connection.

17. The method of claim 15, further comprising:
receiving, by the match network, a synchronization waveform with a first sync level based on a first RF power level of the RF power waveform and a second sync level based on a second RF power level;
receiving, by the match network, at least one characteristic of a third RF power level from the RF power waveform; and
adjusting the match network based on the at least one characteristic of the third RF power level to the match network.

18. The method of claim 17, further comprising:
receiving, by the match network, the synchronization waveform from the frequency generator over a fourth connection; and
receiving, by the match network, the at least one characteristic of the third RF power level from the frequency generator over the second connection or over a third connection.

19. The method of claim 15, further comprising:
receiving, by the match network, a timing delay between arrival of the synchronization waveform and arrival of the RF power waveform; and
adjusting the match network based on the timing delay.

20. The method of claim 19, wherein the timing delay includes, at least, a propagation delay of the RF power waveform from the frequency generator to the match network.

* * * * *